Dec. 16, 1958 A. G. T. BECKING ET AL 2,864,903

TRANSISTOR AMPLIFIER WITH GAIN CONTROL

Filed April 26, 1954

INVENTOR
AUGUSTUS GERARD THEODOOR BECKING
PAUL BLOM
PIETER BOXMAN
BY
AGENT

United States Patent Office
2,864,903
Patented Dec. 16, 1958

2,864,903

TRANSISTOR AMPLIFIER WITH GAIN CONTROL

Augustus Gerard Theodoor Becking, Paul Blom, and Pieter Boxman, Eindhoven, Netherlands, assignors, by mesne assignments, to North American Philips Company, Inc., New York, N. Y., a corporation of Delaware Application April 26, 1954, Serial No. 425,414

Claims priority, application Netherlands May 5, 1953

11 Claims. (Cl. 179—171)

The invention relates to an amplifying circuit comprising the cascade connection of a first transistor and a second transistor and a gain control potentiometer for controlling the amplification factor, this control being included, in series with a separating capacitor, in the circuit of the collector electrode of the first transistor and the base electrode of the second transistor.

Figure 1:
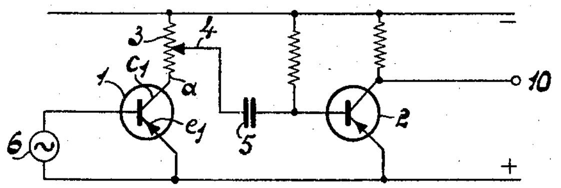

Fig. 1 of the drawing shows a partly known transistor amplifier of this kind, in which the gain control potentiometer 3, 4 is included in the collector circuit of the transistor 1, whilst the sliding contact 4 of the control 3, 4 may be connected through a blocking capacitor 5 to a second transistor 2.

This arrangement has a few disadvantages, which the invention tends to obviate. According to the invention the gain control potentiometer is arranged to provide that with control to a lower amplification the alternating-current impedance of the impedances connected between the base electrode and the emitter electrode of the second transistor increases to substantially avoid voltage pulses occurring in the case of rapid control.

Figure 2:
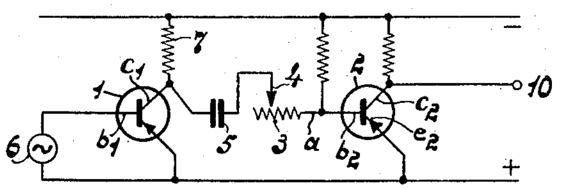
Figure 3:
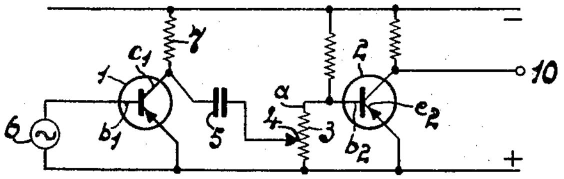
Figure 4:
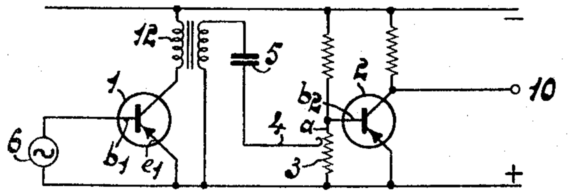

The invention will now be described more fully with reference to the accompanying drawing, in which Figs. 2, 3 and 4 show various embodiments of the invention.

In Fig. 2 the signal oscillations to be amplified from a source 6 are supplied to a base electrode $b_1$ of a first transistor 1, the collector electrode $c_1$ of which is connected through an unvariable resistor 7 to a terminal of a supply source and through a blocking capacitor 5 in series with the gain control potentiometer 3, 4 to the base electrode $b_2$ of the second transistor 2. The amplified output oscillations are derived from an output terminal 10, connected to the collector electrode $c_2$.

Compared with the arrangement shown in Fig. 1, the arrangement of Fig. 2 has two important advantages; if the sliding contact 4 shown in Fig. 1 is moved rapidly into another position, a voltage pulse is produced owing to the voltage gradient across the gain control resistor 3 through which passes direct current, in this case, the collector idle current and supplied to the transistor 2 through the capacitor 5; thus the transistor 2 may even be temporarily cut off. Since according to Fig. 2 no direct current passes through this resistor 3, this arrangement is free from this disadvantage. Moreover, in general, gain control carried out with the aid of a gain control device traversed by direct current is attended with crackling noise, which is, consequently also avoided in the arrangement shown in Fig. 2.

The circuit elements 3, 4 and 5, shown in Fig. 2 may, of course, be interchanged.

In the arrangement shown in Fig. 3, in which corresponding circuit elements are designated by the same reference numerals as those of Fig. 2, the lower side of the gain control resistor 3 is connected to the emitter electrode $e_2$ of the second transistor 2, so that this resistor body 3 is included in the circuit between the electrodes $b_2$ and $e_2$ of the transistor 2.

Moreover the circuit arrangement shown in Fig. 3 has an advantage over that shown in Fig. 2 in that a gain control to an amplification zero is possible, whilst it is furthermore found that the linear potentiometer of Fig. 3 provides a more or less exponential gain control.

The resistor 3 shown in Fig. 3 is traversed, it is true, by a constant direct current, but this current is by a factor lower than the current passing through the resistor 3 of Fig. 1, so that the aforesaid voltage pulse and crackling phenomena are in this case negligible.

It has been found that suitable values for the circuit elements of Fig. 3 are: 10 kilohms for the gain control resistor 3; 2 microfarads for the capacitor 5; 6.8 kilohms for the resistor 7. Junction transistors of PNP type are preferably used, although NPN type transistors may be used if the polarity of the D. C. bias source is suitably reversed.

Fig. 4 shows a variant of the arrangement shown in Fig. 3, in which the resistor 7 of Fig. 3 is replaced by a matching transformer 12; the blocking capacitor 5 in this case also prevents a variation of the bias voltage of the electrode $b_2$ in the case of gain control. The higher amplification obtainable by means of the transformer 12 is based not only on an improved adaptation of the collector circuit of transistor 1 to the base circuit of transistor 2, but also on the fact that the impedance acting upon the collector circuit of transistor 1 is to be chosen to be smaller than that of the arrangement shown in Fig. 3, in order to avoid inadmissible distortion in the case of strong signals.

If in the circuit arrangement shown in Fig. 1 the gain-control resistor 3, coupled if desired through a matching transformer with the collector circuit of transistor 1 were proportioned to be such that in a position $a$ of the sliding contact 4, corresponding to the maximum amplification the signal voltage occurring instantaneously at the collector electrode $c_1$ remains exactly sufficient compared with the voltage at the emitter electrode $e_1$ to remain below a given permissible signal distortion, the impedance acting upon the collector circuit of the transistor 1 would be enhanced and the permissible signal distortion would be exceeded, if the sliding contact 4 occupied a position corresponding to a lower amplification.

However, if a similar adjustment is applied to the arrangement shown in Fig. 4, the impedance acting upon the collector circuit of the transistor 1 is reduced, if the sliding contact 4 of the gain control potentiometer 3, 4 moves from position $a$ of maximum amplification into a position of lower amplification, so that a lower degree of signal distortion will occur.

The source 6, shown in Fig. 4, may, of course, be included in the circuit of the emitter electrode $e_1$, instead of including it in the circuit of the base electrode $b_1$.

It is evident from the various embodiments of the invention that the gain control potentiometer 3, 4 is arranged in a manner such that, if the sliding contact 4 moves from the position $a$ of Figs. 2, 3 and 4 of maximum amplification into a position of lower amplification, the alternating-current impedance of the impedances included between the base electrode $b_2$ and the emitter electrode $e_2$ of these Figs. increases. In the arrangement shown in Fig. 1 this impedance decreases.

What is claimed is:

1. An amplifier circuit having a given permissible signal distortion comprising first and second transistors connected in cascade, each of said transistors having an emitter electrode, a collector electrode and a base electrode, first circuit means for supplying an energizing current to the collector electrode of the first of said transistors and second circuit means independent of the energizing current of said first circuit means for coupling the collector electrode of the first transistor and the base electrode of the second transistor, said second circuit means comprising a direct current blocking capacitor and a variable impedance in series relationship, said variable impedance having one position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the given permissible signal distortion.

2. An amplifier circuit as described in claim 1, wherein said variable impedance comprises a variable resistance.

3. An amplifier circuit having a given permissible signal distortion comprising two transistor stages comprising first and second transistors each having an emitter electrode, a collector electrode and a base electrode, coupling means connected between the collector electrode of the first of said transistors and the base electrode of the second of said transistors, said coupling means comprising a direct current blocking capacitor and a variable impedance, said blocking capacitor being coupled to the collector of said first transistor and said impedance being connected by one terminal to the base electrode of said second transistor, said variable impedance having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the given permissible signal distortion.

4. An amplifier circuit as described in claim 3, wherein said variable impedance comprises a variable resistance.

5. An amplifier circuit having a given permissible signal distortion comprising two transistor stages comprising first and second transistors each having an emitter electrode, a collector electrode and a base electrode, a direct current blocking capacitor having one terminal thereof connected to the collector electrode of the first of said transistors and an impedance element having a variable contact, said impedance element being connected between the base and emitter electrodes of said second transistor and having the variable contact thereof connected to a second terminal of said capacitor, said variable contact having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the permissible signal distortion.

6. An amplifier circuit as described in claim 5, wherein said variable impedance comprises a variable resistance of the type having a contact in slidable engagement with a resistance element.

7. An amplifier circuit comprising two transistor stages comprising first and second transistors each having an emitter electrode, a collector electrode and a base electrode, a coupling transformer having a primary and a secondary winding, said primary winding being connected to the collector electrode of the first of said transistors, a direct current blocking capacitor having one terminal thereof connected to said secondary winding and an impedance element having a variable contact, said impedance element being connected between the base and emitter electrodes of the second of said transistors and having the variable contact thereof connected to a second terminal of said capacitor, said variable contact having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the permissible signal distortion.

8. An amplifier circuit as described in claim 7, wherein said variable impedance comprises a variable resistance of the type having a contact in slidable engagement with a resistance element.

9. A gain control amplifier circuit having a given permissible signal distortion comprising two transistor stages, each said stage comprising a transistor having an emitter electrode, a collector electrode and a base electrode, an alternating current input signal source, said input signal source being connected between the emitter electrode and base electrode of the first of said transistors, a current supply source, a common emitter line and a common collector line, said supply source being connected across said common emitter line and said common collector line, load impedance means interconnecting the collector electrode of each of said transistors to said common collector line, the emitter of each of said transistors being connected to said common emitter line, a direct current blocking capacitor, a gain control variable impedance, said blocking capacitor being series connected between said variable impedance and the collector electrode of said first transistor, said variable impedance being connected by one terminal to the base electrode of the second of said transistors and having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the given permissible signal distortion, an impedance connected from said base electrode of said second transistor to said common collector line, the output of said amplifier circuit being taken from the collector electrode of the second of said transistors.

10. A gain control amplifier circuit having a given permissible signal distortion comprising two transistor stages, each said stage comprising a transistor having an emitter electrode, a collector electrode and a base electrode, an alternating current input signal source, said input signal source being connected between the emitter electrode and base electrode of the first of said transistors, a current supply source, a common emitter line and a common collector line, said supply source being connected across said common emitter line and said common collector line, load impedance means interconnecting the collector electrode of each of said transistors to said common collector line, the emitter of each of said transistors being connected to said common emitter line, a direct current blocking capacitor, a gain control variable impedance of the type having a contact tap in slidable engagement with an impedance element, said blocking capacitor being series connected between the contact tap of said variable impedance and the collector electrode of said first transistor, the impedance element of said variable impedance being connected between the base electrode of the second of said transistors and said common emitter line and having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the given permissible signal distortion, an impedance connected from said base electrode of said second transistor to said common collector line, the output of said amplifier circuit being taken from the collector electrode of the second of said transistors.

11. A gain control amplifier circuit having a given permissible signal distortion comprising two transistor stages, each said stage comprising a transistor having an emitter electrode, a collector electrode and a base electrode, an alternating current input signal source, said input signal source being positioned between the emitter electrode and base electrode of the first of said transistors, a current supply source, a common emitter line and a common collector line, said supply source being connected across said common emitter line and said common collector line, the collector electrode of said first transistor being connected to said common collector line through the primary of a matched transformer, load impedance means connecting the collector electrode of the second of said transistors to said common collector line, the emitter of each of said transistors being connected to said common emitter line, a direct current blocking capacitor, a gain control variable impedance of the type having a contact tap in slidable engagement with an impedance element, said blocking capacitor being series connected between the contact tap of said variable impedance and a terminal of the secondary of said matched transformer, the other terminal of the secondary of said matched transformer being connected to said common emitter line, the impedance element of said variable impedance being connected between the base electrode of said second transistor and said common emitter line and having a position corresponding to maximum amplification at which the amplifier circuit has a given permissible signal distortion and having other positions corresponding to amplifications less than maximum such that a decrease in the amplification of said circuit corresponding to said other positions simultaneously increases the input impedance of said second transistor without increasing the given permissible signal distortion, an impedance connected from said base electrode of said second transistor to said common collector line, the output of said amplifier circuit being taken from the collector electrode of the second of said transistors.

References Cited in the file of this patent

UNITED STATES PATENTS

| | | |
|---|---|---|
| 1,822,922 | Culver | Sept. 15, 1931 |
| 2,517,960 | Barney et al. | Aug. 8, 1950 |
| 2,544,211 | Barton | Mar. 6, 1951 |
| 2,647,957 | Mallinckrodt | Aug. 4, 1953 |

OTHER REFERENCES

Mallory Yaxley Radio Service Encyclopaedia (pp. 117–121, page 120, Fig. 96) January 1937. Copy in 179–171–9C.